United States Patent [19]
Keating

[11] Patent Number: 5,831,454
[45] Date of Patent: *Nov. 3, 1998

[54] EMITTER COUPLED LOGIC (ECL) GATE

[75] Inventor: Pierce V. Keating, Pompano Beach, Fla.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 673,858

[22] Filed: Jul. 1, 1996

[51] Int. Cl.⁶ .................................................. H03K 19/086
[52] U.S. Cl. ............................... 326/126; 326/52; 326/54; 326/127
[58] Field of Search .................................... 326/126, 127, 326/52, 54, 89

[56] References Cited

U.S. PATENT DOCUMENTS

| | | | |
|---|---|---|---|
| 4,516,039 | 5/1985 | Matsuzaki et al. | 307/455 |
| 5,079,452 | 1/1992 | Lain et al. | 307/480 |
| 5,148,059 | 9/1992 | Chen et al. | 326/126 X |
| 5,220,212 | 6/1993 | Sinh | 307/455 |
| 5,250,860 | 10/1993 | Chu et al. | 326/126 X |
| 5,289,055 | 2/1994 | Razavi | 307/455 |

OTHER PUBLICATIONS

Razavi, B., Ota, Y., Swartz, R. G., "Design Techniques for Low–Voltage High–Speed Digital Bipolar Circuits," IEEE, Journal of Solid–State Circuits, vol. 29, No. 3, Mar. 1994.

*Primary Examiner*—Do Hyun Yoo
*Attorney, Agent, or Firm*—Barbara R. Doutre

[57] ABSTRACT

An emitter coupled logic gate (300) avoids the use of stacked transistors by utilizing a single-ended bias input and positive feedback (320) between first and second transistors (304, 306) to achieve an inverter function. The inverter (300) can also be configured as an OR gate (500) by adding a third transistor biased by second single-ended logic input. The OR gate (500) can be configured into an exclusive OR gate (901) by converting another set of single-ended bias inputs into what can be either differential or non-differential outputs (921, 923) to be used as inputs to OR gate (919).

11 Claims, 8 Drawing Sheets

EMITTER COUPLED LOGIC (ECL) GATE

TECHNICAL FIELD

This invention relates in general to digital bipolar logic circuits, and more particularly emitter coupled logic circuits.

BACKGROUND

In integrated circuit designs using low supply voltages, a designer is severely constrained with regard to stacking devices within a circuit. For emitter coupled logic (ECL) circuits, the transistor stacking constraint often rules out many traditional current steering topologies. Some non-stacked ECL structures do exist, however most of these structures require input signals whose voltages exceed the minimum switching threshold of a differential pair and therefore require a higher supply voltage. The minimum switching threshold for a differential pair is usually considered to be the differential voltage level at which substantially all the current becomes switched through one transistor of the differential pair.

Referring to FIG. 1, there is shown a prior art ECL exclusive OR gate 100 which utilizes two sets of stacked differential amplifiers 102, 104, 106. A disadvantage associated with ECL gate 100 is that the voltage drop from the collector to emitter (VCE) associated with each transistor pair is added to the required voltage across the load and bias elements. The use of stacked transistors thus requires a higher supply voltage, Vcc. Differential pair 106 is used as a current steering device to control which pair of the differential amplifiers 102, 104 is in operation. The use of stacked transistors and current steering makes implementation of ECL gate 100 difficult when designing circuits for low supply voltages, particularly those under three volts.

FIG. 2 is a prior art ECL circuit 200 which avoids the use of stacked transistors in an OR gate. A drawback of the ECL circuit 200 is that it requires single-ended inputs having large voltage swings which exceed the minimum switching threshold for a differential pair. Another drawback associated with circuit 200 is that it requires the use of a voltage reference, Vref, 202 to establish a switching point for the single-ended input signals A and B. Additional current and surface area are required to implement the voltage reference 202.

Accordingly, there is need for an ECL circuit which is capable of performing a logic function at low supply voltages while minimizing the use of stacked transistors. It would be a further benefit if these circuits would riot require or produce signals which are larger than the minimum switching threshold of a differential pair and thereby allow operation at a minimum supply voltage.

DETAILED DESCRIPTION OF THE PREFERRED EMBODIMENTS

Figure 3:
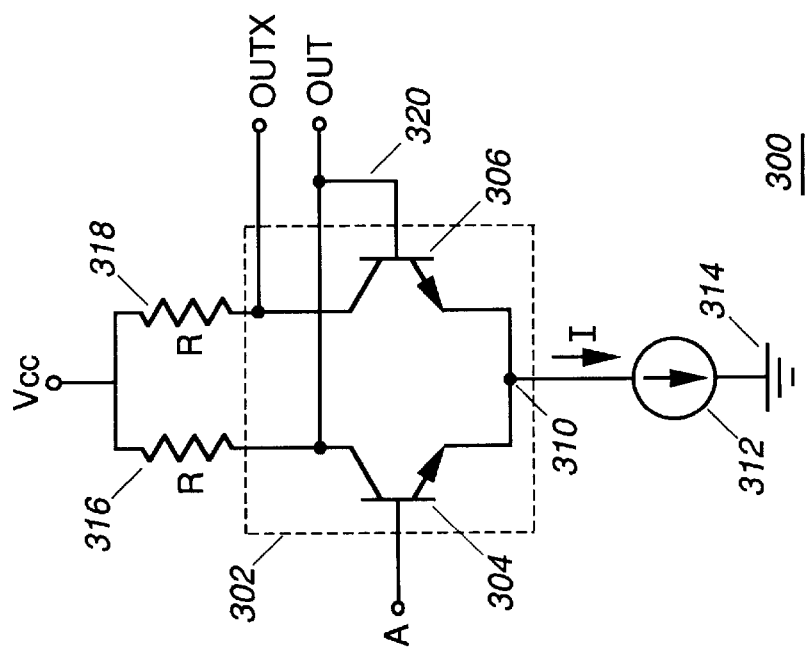
FIG. 3 is an emitter coupled logic gate in accordance with a first embodiment of the invention.

Referring to FIG. 3, there is shown an emitter coupled logic (ECL) circuit in accordance with a first embodiment of the present invention. ECL gate 300 includes a differential amplifier 302 including first and second transistors 304, 306 each having a collector, base, and emitter. The emitters of the transistors 304, 306 are coupled to a common node 310 and a current source 312 is coupled between the common node and ground potential 314 to sink current from the common node. A first load resistor 316 is coupled in series between the collector of the first transistor and a voltage source, Vcc. A second load resistor 318 is coupled in series between the collector of the second transistor 306 and the voltage source, Vcc.

The base of the first transistor 304 is responsive to a single-ended logic input, A, while the base of the second transistor 306 is coupled to the collector of the first transistor 304 to provide a positive feedback path 320. Output signals OUTX, OUT are differential outputs which are produced at the collector of the second transistor 306 and the feedback path 320.

In accordance with a first embodiment of the invention, ECL gate 300 provides an inverter function through the use of a differential pair 302 responsive to a single-ended input, A, which generates a differential output, OUT, OUTX through the use of positive feedback 320. The inverter circuit provided by ECL gate 300 provides good hysteresis at low supply voltage levels without the use of stacked transistors.

In operation of ECL gate 300, the first transistor 304 is biased substantially "off" when the input logic signal, A, is less than output signal OUT, thereby raising the voltage level of output signal OUT to be substantially equal to the voltage source, Vcc, while the second transistor 306 is biased substantially "on" by signal OUT. When transistor 306 is biased substantially "on" a current path is provided to ground potential through the second load resistor 318, the collector of the second transistor 306, and the current source 312, thereby lowering the voltage of output signal, OUTX.

The first transistor 304 is biased substantially "on" when the input logic signal, A, is greater than (or equal to) output signal OUT. When transistor 304 is biased substantially "on" a current path is provided to ground potential 314 through the first load resistor 316, the collector of the first transistor 304, and the current source 312. The voltage level of output signal OUT becomes lowered due to a voltage drop across the first load resistor 316, and the second transistor 306 becomes biased substantially "off" by output signal OUIX thereby raising the voltage level of output signal OUT to be substantially equal to voltage source, Vcc.

The ECL gate 300 of the present invention provides an inverter function wherein output signal OUT provides a negative output which is approximately 180 degrees out of phase with the logic input signal, A. The signal OUT is then provided to the base of transistor 306. Since the emitters of the differential pair 302 are coupled together, the base-emitter voltage drop, Vbe, of transistor 304 increases or decreases in response to the feedback, in phase with the input signal, A, resulting in positive feedback. The ECL gate 300 of the present invention utilizes a differential pair 302 responsive to a single-ended input, A, for generating a differential output OUT, OUTX through the use of positive feedback.

Figure 1:
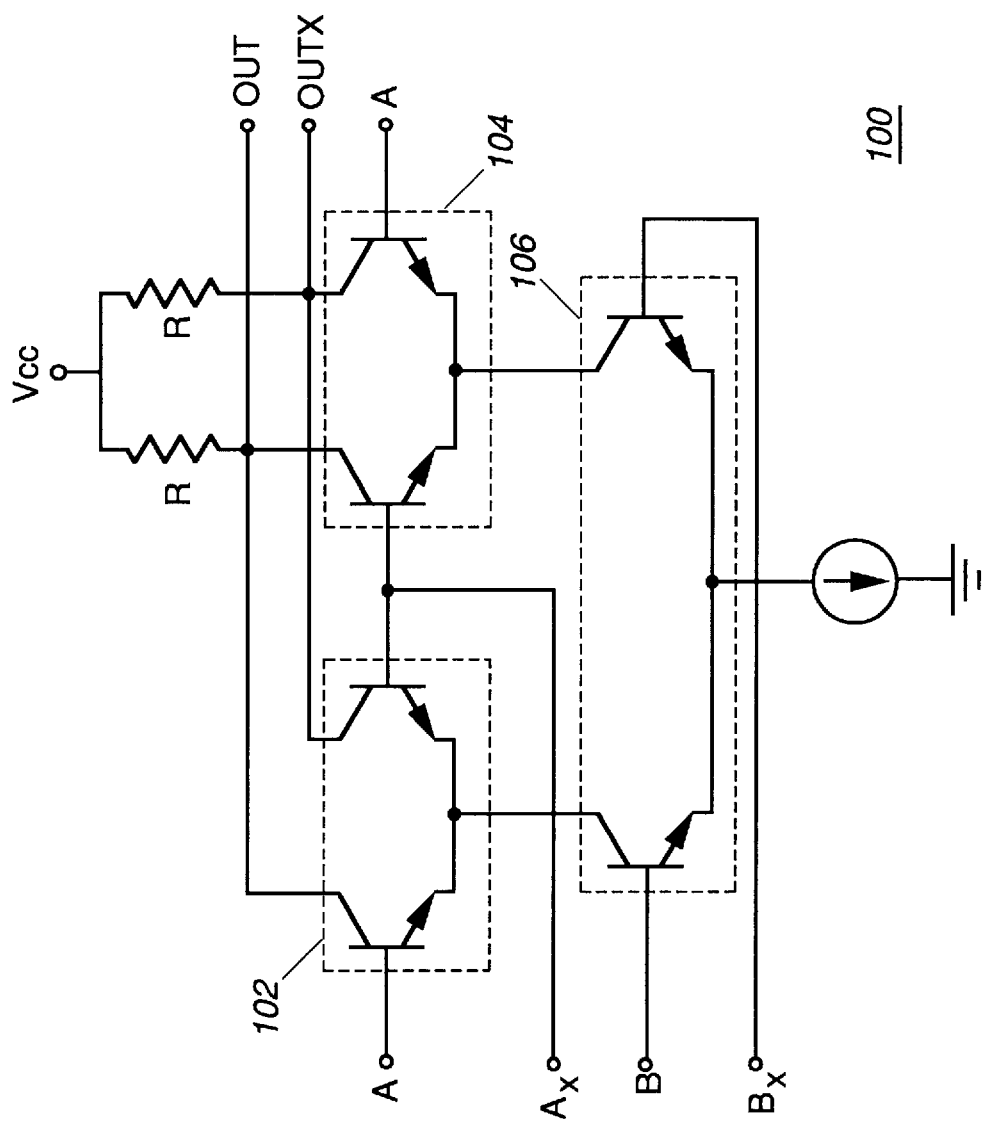
FIG. 1 is a prior emitter coupled logic exclusive OR (XOR) gate.
Figure 2:
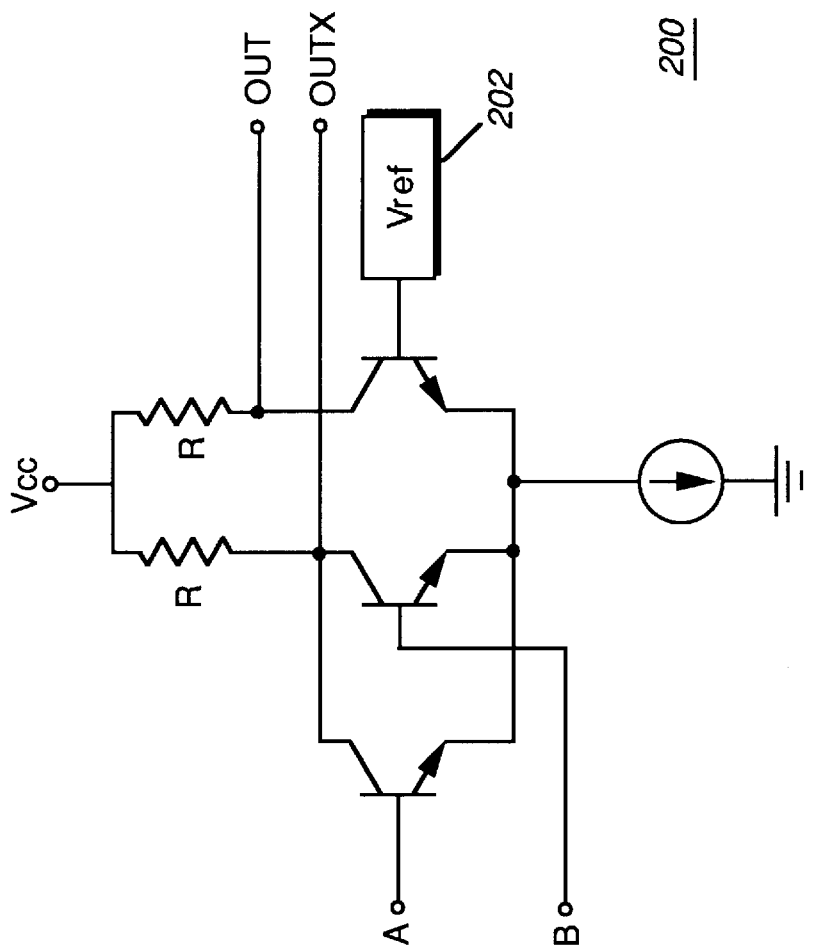
FIG. 2 is a prior art emitter coupled logic OR gate.
Figure 4:
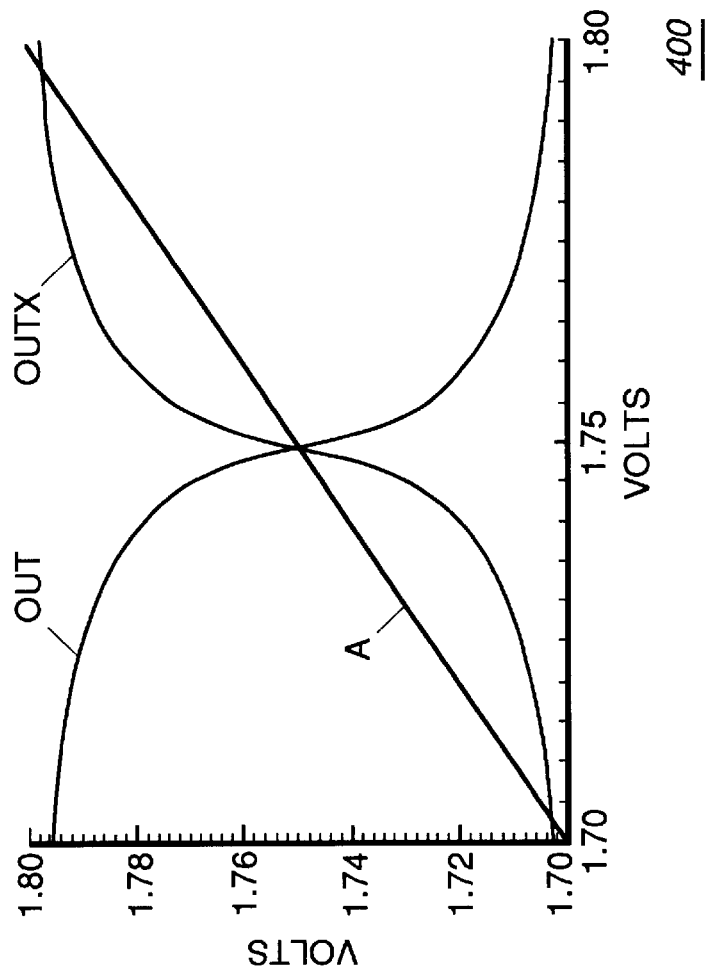
FIG. 4 is a graph of a simulated response for the emitter coupled logic gate of FIG. 3.

FIG. 4 is a graph 400 illustrating the switching characteristic of the ECL gate 300 in response to a ramped input signal, A. While the description of FIG. 3 employs npn transistors, one skilled in the art appreciates that the ECL gate 300 of the present invention can also be configured with pnp transistors. The inverter circuit of the present invention can also be employed as a single-to-differential converter, or as an economical voltage comparator without the need for a separate voltage reference.

Figure 5:
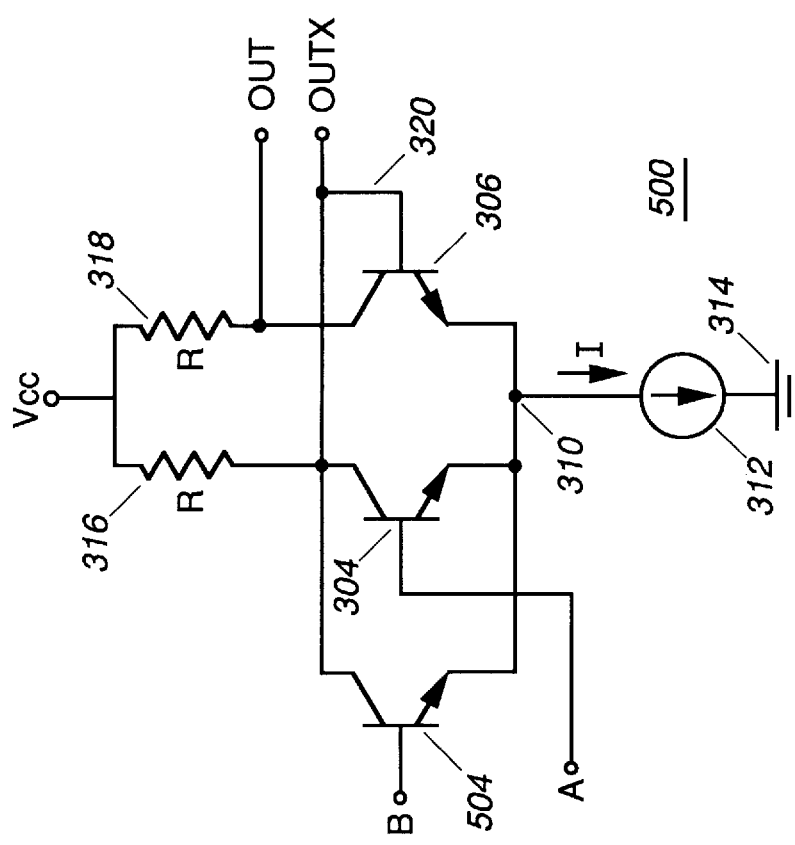
FIG. 5 is an emitter coupled logic gate in accordance with a second embodiment of the invention.

Referring to FIG. 5, there is shown an ECL gate 500 in accordance with a second embodiment of the invention. ECL gate 500 provides an OR function by adding a third transistor 504 across the collector-emitter junction of the first transistor 304 of FIG. 3 and feeding the circuit with a second single-ended logic input, B. Like numerals from FIG. 3 have been carried forward where applicable. The third transistor 504 has a collector, base and emitter, the emitter being coupled to the common node 310, and the collector being coupled to the collector of the first transistor 304. The third transistor 504 is biased by the second single-ended input logic signal, B. The OR gate is formed when two or more single-ended inputs A, B are coupled to the respective bases of transistors 304, 504 whose collectors and emitters are coupled together and which utilize the feedback 320 described in FIG. 3.

In operation, when either or both of the input signals A, B is greater than (or equal to) output signal OUTX, a current path is provided through one or both of the first transistor and third transistors 304, 504, the first load resistor 316, and the current source 312. Turning on either of the first and/or third transistors 304, 504 decreases the voltage level of signal OUTX, which in turn biases the second transistor 306 substantially "off". With the second transistor 306 biased substantially "off", the voltage level of signal OUT rises to be substantially equivalent to supply, Vcc.

When both single-ended inputs A and B are lower than (or equal to) OUTX, the first and third transistors 304, 504 turn "off" and output signal OUTX rises to supply, Vcc, turning on second transistor 306, and pulling output signal OUT low. Thus, when either single-ended input A or B is high, output OUT will be high, and when both single-ended inputs A and B are low output signal OUT will be low providing an OR function.

Once again the ECL gate 500 differs from conventional ECL circuits in that single-ended inputs are used in conjunction with positive feedback eliminating the need for stacking devices. Positive feedback is used to achieve hysteresis and provide a differential output, OUT, OUTX. The collectors of transistors 304 and 504 are coupled to form a summing junction which generates a logical OR function. The voltage swings in ECL gate 500 are substantially equivalent to the magnitude of the input signals, A, B. These voltage swings can be equivalent to the minimum voltage switching threshold for the differential pair since the positive feedback assists in correctly switching the device. While shown and described with two single-ended inputs, A, B, the OR gate 500 of the present invention allows for additional transistors to be coupled across the collector-emitter junction of the first transistor 304 to receive additional single-ended inputs, if desired, while still providing an equivalent OR gate.

While ECL gate 500 has been described as providing an OR function, one skilled in the art appreciates that an AND gate (not shown) can also be configured by inverting all inputs and outputs of the OR gate. Similarly, other gates, such as NOR and NAND gates, can also be configured by manipulating the output of the ECL gate 500. The low voltage swings of ECL gate 500 make it ideal for combining logic functions and circuits. For instance, the OR gate described above can be incorporated into the first stage of an ECL flip flop, forming the equivalent of an OR gate output driving a flip flop input.

Figure 7:
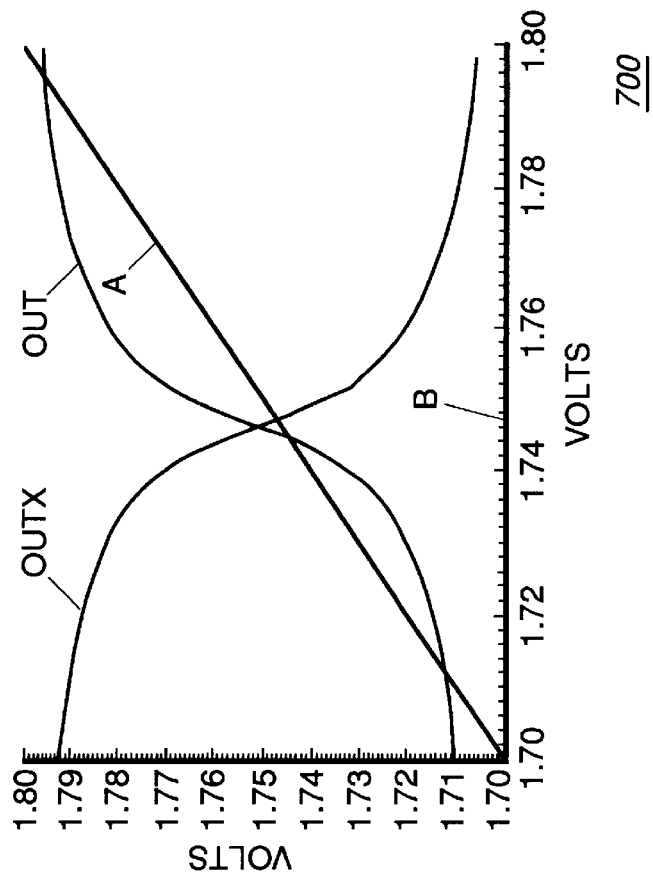
FIG. 7 is a graph of a simulated response for the emitter coupled logic gate of FIG. 5 under a second set of logic input conditions.
Figure 6:
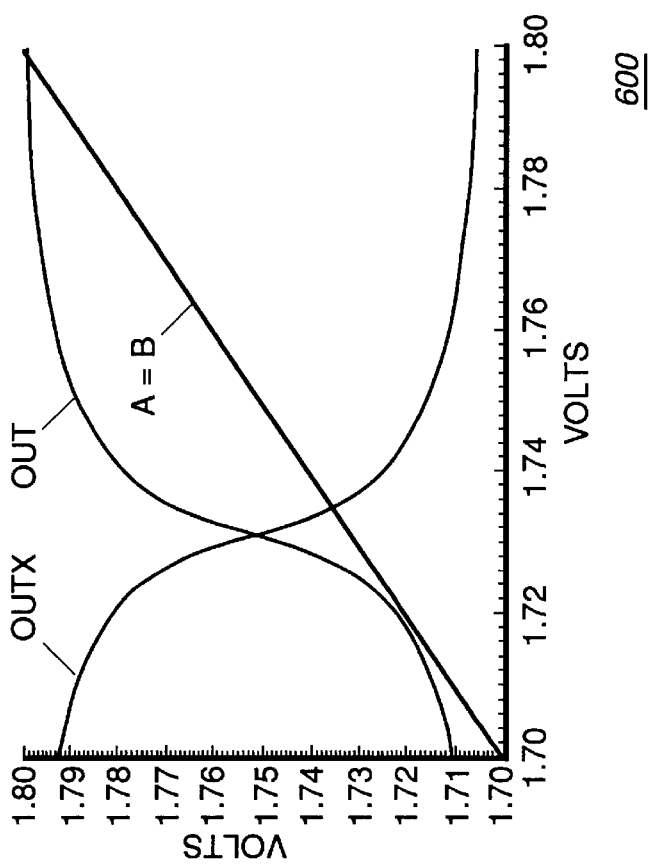
FIG. 6 is a graph of a simulated response for the emitter coupled logic gate of FIG. 5 under a first set of logic input conditions.

FIG. 6 is a graph simulating the response of the ECL gate 500 under a first set of ramped logic conditions for input signals A and B. Graph 600 illustrates the switching characteristic achieved when the input signals A and B are ramped at substantially the same voltage levels. FIG. 7 is a graph simulating the response of the ECL gate 500 under a second set of logic conditions for input signals A and B. Graph 700 illustrate the switching characteristic achieved when the input signal A is ramped while input signal B is held to a logic level low. FIGS. 6 and 7 illustrate how the switching point is shifted depending on the logic level inputs due to a gain imbalance of the circuit.

Figure 8:
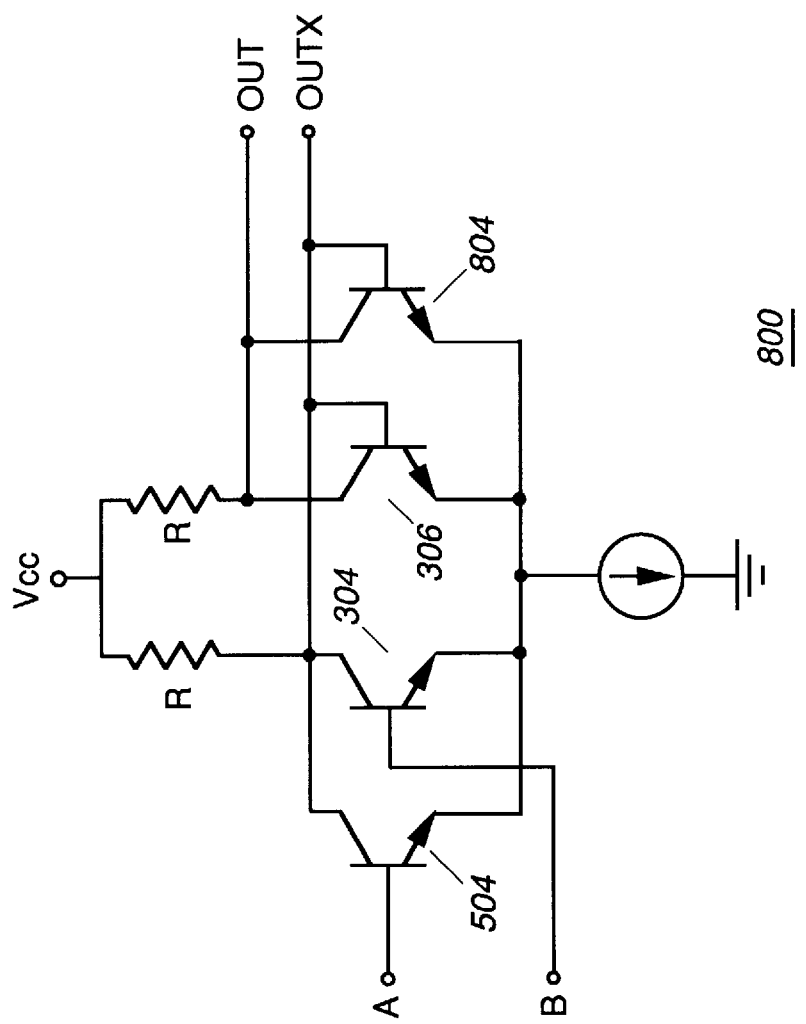
FIG. 8 is an emitter coupled logic gate in accordance with a third embodiment of the invention.

Referring to FIG. 8, there is shown an ECL gate 800 in accordance with a third embodiment of the invention. ECL gate 800 still provides an OR function similar to that provided by the ECL circuit shown in FIG. 5 but further includes the addition of a fourth transistor 804 across the collectore-mitter junction of the third transistor 306. The addition of the fourth transistor essentially manipulates the equivalent size of the operating device in the positive feedback path and can be used to alter the electrical characteristics, such as balancing gain and shifting the switching points of the OR gate.

Figure 9:
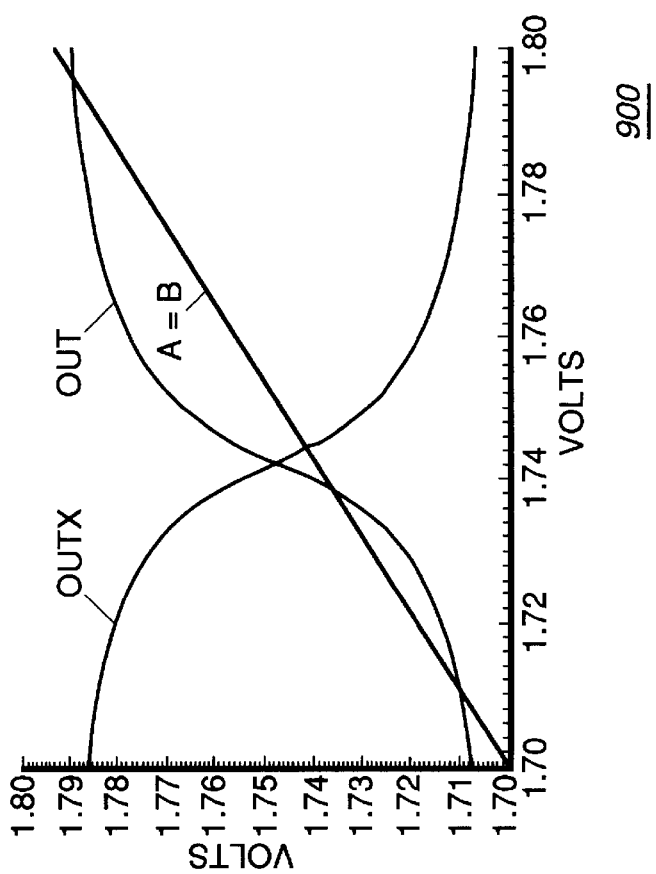
FIG. 9 is a graph of a simulated response for the emitter coupled logic gate of FIG. 8 under a first set of logic input conditions.
Figure 10:
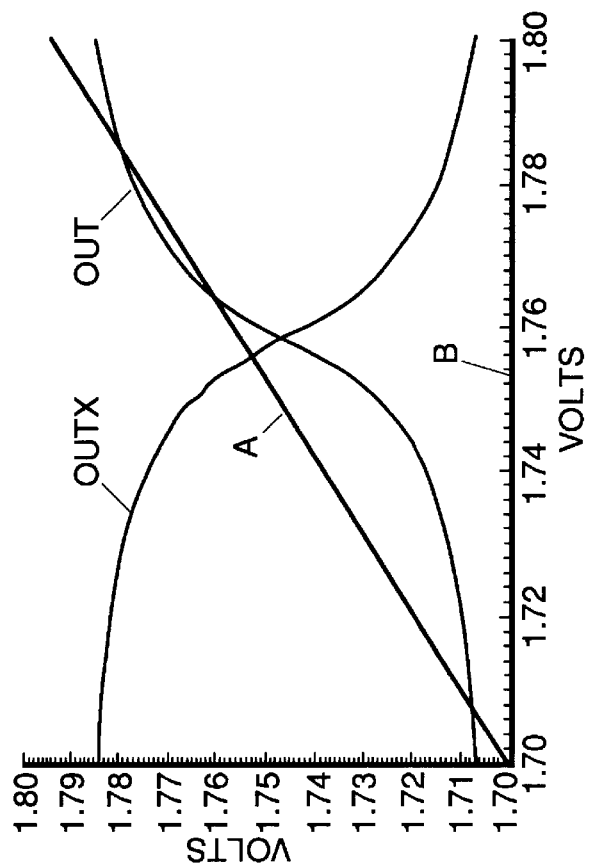
FIG. 10 is a graph of a simulated response for the emitter coupled logic gate of FIG. 8 under a second set of logic input conditions.

FIG. 9 is a graph simulating the response of the ECL gate 800 under a first set of ramped logic conditions for input signals A and B. Graph 900 illustrates the switching characteristic achieved when the input signals A and B are ramped at substantially the same logic levels. FIG. 10 is a graph simulating the response of the ECL gate 800 under a second set of logic conditions for input signals A and B. Graph 900 illustrate the switching characteristic achieved when the input signal A is ramped while input signal B is held to a logic level low. FIGS. 9 and 10 illustrate how the switching points can be shifted and centered about the input signals, A, B (as compared to the switching points seen in the graphs of FIGS. 6 and 7) by altering the transistor device(s) in the feedback path of the OR gate.

Figure 11:
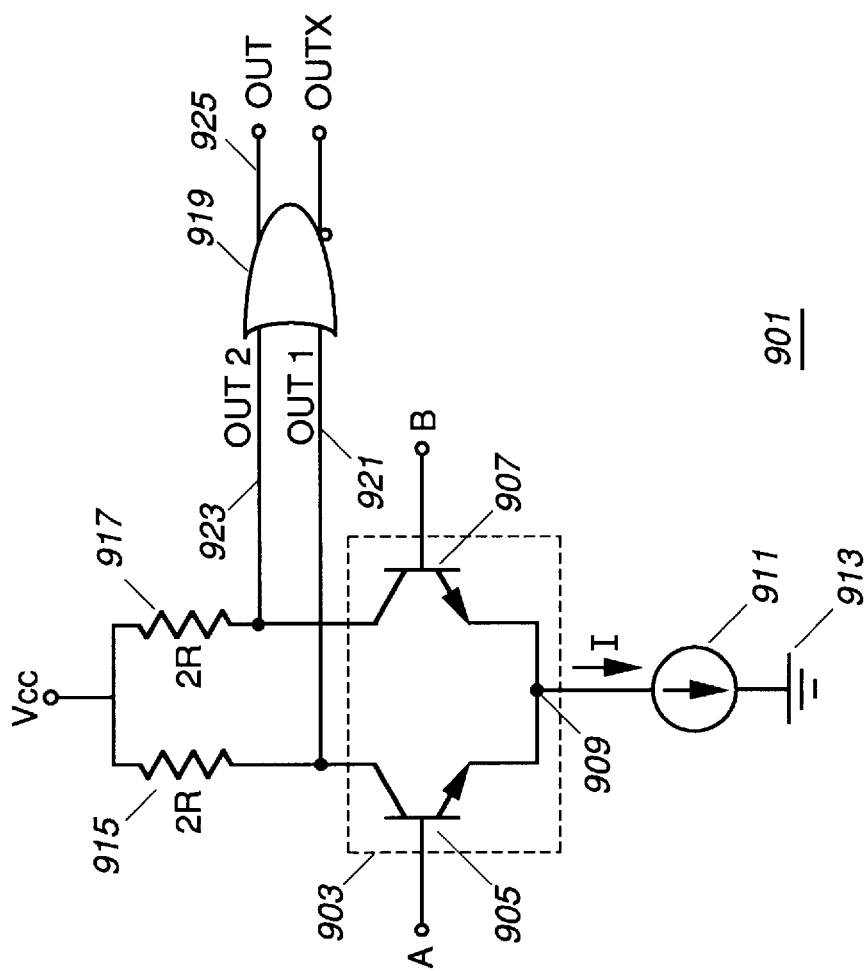
FIG. 11 is an emitter coupled logic exclusive OR gate in accordance with a fourth embodiment of the invention.

Referring now to FIG. 11, there is shown an ECL gate 901 in accordance with a fourth embodiment of the invention. ECL gate 901 includes a differential amplifier 903 formed of first and second transistors 905, 907 each having a base, emitter and collector, the emitters being coupled to a common node 909. ECL gate 901 further includes a current source 911 coupled between the common node 909 and ground potential 913 to sink current from the common node 909. A first load resistor 915 is coupled in series between the collector of the first transistor 905 and a voltage source, Vcc.

A second load resistor 917, is coupled in series between the collector of the second transistor 907 and the voltage source, Vcc. The base of the first transistor 905 is responsive to a first input logic signal, A, while the base of the second transistor 907 is responsive to a second input logic signal, B. First and second input logic signals A, B are substantially equivalent to one of two possible voltage levels, both levels being of sufficient voltage to forward bias the base-emitter junction of the transistors 905, 907 when the input logic signals A, B are substantially equal to each other.

ECL gate 901 further includes an OR gate 919 having two inputs, one input being connected to the collector of the first transistor 905, the second input being coupled to the collector of the second transistor 907. These first and second inputs are identified by designators 921, 923 and are also referred to as the outputs, OUT1, OUT2 respectively of the differential pair 903. The outputs, OUT, OUTX, generated by OR gate 919 are differential. The output, OUT, 925 of OR gate 919 is set to a logic high when the voltage level of either input 921, 923 is substantially equal to supply, Vcc. The output, OUT, of OR gate 919 is set to a logic low when neither input 921, 923 is substantially equal to supply, Vcc.

The resistor values of resistors 915, 917 are selected to produce a voltage drop of at least the minimum switching threshold voltage of a differential pair, $V_{th}$, for one half the bias current, or I/2. Therefore, the value of the resistors 915 and 917 is $V_{th}/(I/2)=2R$, meaning that for a bias current I, the voltage drop across the resistor is 2Vth, or twice the required switching threshold.

The ECL XOR gate 901 of the present invention differs from the prior art in that logic functionality is not accomplished by directly steering current, but rather by performing a logical OR operation on the outputs of the differential pair 903. Signals 921, 923 generated from the differential pair 903 can be differential or non-differential depending on the logic input signals, A, B. Outputs OUT1, OUT2 are not necessarily viewed as differential in ECL gate 901, but are instead referenced to supply voltage, Vcc, when evaluated by the OR gate 919. OR gate 919 generates a logical one or zero through a comparison of the input signals 921, 923 to substantially supply, Vcc, according to the predetermined minimum switching threshold, $V_{th}$.

OR gate 919 is preferably formed in accordance with the second or third embodiments of the invention, however, other OR gate configurations known in the art may also be substituted. The OR gate 919 is responsive to the supply referenced outputs, 920, 922 which can be both differential or non-differential depending on the logic input conditions of A and B. An exclusive OR condition occurs when one transistor of the differential pair is shut off, and when the collector voltage of that transistor is equivalent to supply, Vcc. The logical output of the OR gate 919 subsequently generates a logical one. Therefore the ECL gate 901 only produces a logical one when the inputs A and B differ by at least $V_{th}$.

The following table shows an example of the ECL gate 901 under various conditions of logic inputs A and B altering between 1.9 volts and 2.0volts with a supply, Vcc, of approximately 2.0 volts. The minimum switching voltage of a differential pair, $V_{th}$, is assumed to be approximately 100millivolts.

| A (volts) | B (volts) | OUT1 logic level/ volts | OUT2 logic level/ volts | OUT logic level | OUTX logic level |
|---|---|---|---|---|---|
| 2.0 | 2.0 | 0(1.9) | 0(1.9) | 0 | 1 |
| 2.0 | 1.9 | 0(1.8) | 1(2.0) | 1 | 0 |
| 1.9 | 2.0 | 1(2.0) | 0(1.8) | 1 | 0 |
| 1.9 | 1.9 | 0(1.9) | 0(1.9) | 0 | 1 |

Hence, the outputs OUT1, OUT2 are only differential when input logic conditions A, B are dissimilar. When logic input signals A, B are substantially equivalent, a non-differential set of outputs OUT1, OUT2 are generated. The outputs OUT and OUTX of OR gate 919 reflects the exclusive OR function of the circuit 901.

All of the ECL gates described in the embodiments of FIGS. 3, 5, and 8, and 11 are fed by single-ended inputs using a single differential pair. The ECL gates described by the invention avoid the use of stacked transistors and avoid the use of current steering, making them ideal for low voltage applications, such as 1.8 volts. Other advantages to the ECL circuits described by the invention include fast switching times and good hysteresis. All of these circuits are easily integratable taking up little area making them ideal for today's smaller component requirements having stringent area restrictions.

Numerous modifications, changes, variations, substitutions, and equivalents will occur to those skilled in the art without departing from the spirit and scope of the present invention as defined by the appended claims.

What is claimed is:

1. An emitter coupled logic (ECL) gate, comprising
   a differential pair having first and second emitter coupled transistors, the differential pair being fed by a first single-ended input applied to a base of the first transistor, a collector of the first transistor being directly coupled to a base of the second transistor and providing a positive feedback path between the first and second transistors, the feedback path providing a first output and a collector of the second transistor providing a second output, wherein the first and second outputs are differential;
   a current source coupled to the emitters of the first and second emitter coupled transistors for biasing current through the differential pair; and
   first and second load resistors coupled to the collectors of the first and second transistors.

2. An ECL gate as described in claim 1, wherein the ECL gate comprises an inverter.

3. An ECL gate as described in claim 1, further comprising:
   a third transistor having a collector coupled to the collector of the first transistor and an emitter coupled to the common emitters of the first and second emitter coupled transistors, the third transistor receiving a second single-ended input.

4. An ECL gate as described in claim 3, wherein the ECL gate provides a logic function substantially equivalent to an OR gate.

5. An ECL gate as described in claim 3, wherein the ECL gate provides a logic function substantially equivalents to NOR gate.

6. An ECL gate as described in claim 3, wherein the ECL gate provides a logic function substantially equivalent to an AND gate.

7. An ECL gate as described in claim 3, wherein the ECL gate provides a logic function substantially equivalent to a NAND gate.

8. An ECL gate as described in claim 3, further comprising:
   a fourth transistor having a collector coupled to the collector of the second transistor, and an emitter coupled to the common emitters of the first and second emitter coupled transistors, and a base coupled to the positive feedback path.

9. An emitter coupled logic (ECL) gate, comprising:

a differential pair having first and second emitter coupled transistors, the first transistors biased from a first single-ended logic input;

a positive feedback path directly coupling a base of the second transistor to a collector of the first transistor;

a third transistor having an emitter coupled to the emitter coupled transistors and a collector coupled to the positive feedback path, the third transistor being biased from a second single-ended logic input; and first and second outputs, the first output being generated at the positive feedback path and the second output being generated at a collector of the second transistor, the first and second outputs providing differential output signals under the logic levels provided by the first and second single-ended logic inputs.

10. An ECL gate as described in claim 9, further comprising a fourth transistor having an emitter coupled to the emitter of the third transistor and a collector coupled to the collector of the second transistor, and a base coupled to the positive feedback path, the second and fourth transistors controlling a switching point for the ECL gate.

11. An ECL gate as described in claim 9, wherein the first and second outputs provide and OR function under the logic levels provided by the first and second single-ended logic inputs.

* * * * *